(12) United States Patent
Ramakrishnan et al.

(10) Patent No.: US 10,128,828 B2
(45) Date of Patent: Nov. 13, 2018

(54) SYNCHRONOUS, INTERNAL CLOCK EDGE ALIGNMENT FOR INTEGRATED CIRCUIT TESTING

(71) Applicant: Cirrus Logic International Semiconductor, Ltd., Edinburgh (GB)

(72) Inventors: Muraleedharan Ramakrishnan, Austin, TX (US); Bhoodev Kumar, Austin, TX (US); Vivek Oppula, Austin, TX (US); Niju Alex Geevarughese, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 29 days.

(21) Appl. No.: 15/485,062

(22) Filed: Apr. 11, 2017

(65) Prior Publication Data

US 2017/0310315 A1 Oct. 26, 2017

Related U.S. Application Data

(60) Provisional application No. 62/325,442, filed on Apr. 20, 2016.

(51) Int. Cl.
*H03L 7/00* (2006.01)
*H03K 5/26* (2006.01)

(52) U.S. Cl.
CPC .................................... *H03K 5/26* (2013.01)

(58) Field of Classification Search
None
See application file for complete search history.

(56) References Cited

U.S. PATENT DOCUMENTS 7,725,754 B1 5/2010 Stadler
8,699,627 B2 * 4/2014 Crepaldi .............. H04B 1/7183
375/316

(Continued)

OTHER PUBLICATIONS

Wu et al., Using Launch-on-Capture for Testing Scan Designs Containing Synchronous and Asynchronous Clock Domains, IEEE Transactions on Computer-aided Design of Integrated Circuits and Systems, Mar. 2011, pp. 455-463, vol. 30, No. 3.

(Continued)

*Primary Examiner* — Lincoln Donovan
*Assistant Examiner* — Khareem E Almo
(74) *Attorney, Agent, or Firm* — Terrile, Cannatti & Chambers, LLP; Kent B. Chambers

(57) ABSTRACT

A synchronous clock edge alignment system and method increases detection coverage of transition delay faults that occur in logic circuits that have data released by a clock at an input of logic circuits internal to an integrated circuit and/or released at the output of the logic circuits when testing an integrated circuit. To increase detection coverage of inter-clock transition delay faults, in at least one embodiment, the synchronous clock edge alignment system and method align same transition type edges of internal data releasing clock signals, and at least two of the clock signals have different frequencies. By aligning the edges of the clock signals, transition delay faults that might otherwise not have occurred can be detected by, for example, a conventional circuit testing apparatus. Thus, aligning the edges of the clock signals increases detection of inter-clock transition delay faults.

20 Claims, 16 Drawing Sheets

(56) References Cited

U.S. PATENT DOCUMENTS 9,899,992 B1 * 2/2018 Sadowski ............ H03K 3/0375
2017/0310315 A1 * 10/2017 Ramakrishnan ......... H03K 5/26

OTHER PUBLICATIONS

Wang et al. Using Launch-on-Capture for Testing BIST Designs Containing Synchronous and Asynchronous Clock Domains, IEEE Transactions on Computer-aided Design of Integrated Circuits and Systems, Feb. 2010, pp. 99-312, vol. 29, No. 10.
Shetye, K., Transition Delay Faults, Term Paper, ELEC 7250, Auburn University, Apr. 23, 2004, pp. 1-4.
Combined Search and Examination Report under Sections 17 and 18(3) dated Aug. 1, 2017, mailed in Application No. GB1706215.9, pp. 1-6.
Response to the Combined Search and Examination Report under Sections 17 and 18(3) dated Aug. 1, 2017, as filed in Application No. GB1706215.9 on Apr. 16, 2018, pp. 1-15.

* cited by examiner

SYNCHRONOUS, INTERNAL CLOCK EDGE ALIGNMENT FOR INTEGRATED CIRCUIT TESTING

BACKGROUND OF THE INVENTION

Field of the Invention

The present invention relates in general to the field of electronics, and more specifically to integrated circuits, design for testing systems, and synchronous clock edge alignment for integrated circuit testing to increase detection coverage of inter-clock transition delay faults during testing of an integrated circuit.

Description of the Related Art

Integrated circuit testing assists in validating functionality of logic circuits of the integrated circuit. Functional validation often assists in identifying logical defects and in identifying manufacturing defects that can adversely affect the correct function of the integrated circuit. To assist with testing, entities, such as integrated circuit manufacturers, often incorporate "Design for testing" (also referred to as "design for testability") (DFT) techniques that add testability features to a hardware product design. Such added features can make it easier to develop and apply manufacturing tests to the integrated circuit.

FIG. 1, labeled prior art, depicts a conventional circuit testing apparatus 100 for testing integrated circuit 102. The integrated circuit 102 plugs into the circuit testing apparatus 100, and the circuit testing apparatus 100 provides DATA_IN[0:N] to an input of data gate 104. In this embodiment, the data DATA_IN[0:N] represents N+1 bits of test pattern data, where "N" is an integer greater than or equal to 1. In one embodiment, the data gate 104 includes "N" D-flip flops, and synchronous clock signals CLK_IN[0:N] control the transfer of the data DATA_IN[0:N] from the input of data gate 104 to logic circuits 106. The logic circuits 106 includes combinational or sequential logic gates and operates on the data DATA_IN[0:N] to generate M+1 bits of output data DATA_OUT[0:M], where "M" is an integer greater than or equal to 0. The logic circuits 106 transfers the output data DATA_OUT[0:M] to data gate 108. In one embodiment, data gate 108 includes "M" D-flip flops, and synchronous clock signals CLK_OUT[0:M] control the transfer of the data DATA_OUT[0:M] from the logic circuits 106 to the input of data gate 108. The circuit testing apparatus 100 then determines whether the integrated circuit 102 is functioning correctly or is a faulty device due to logical and/or manufacturing defects by evaluating the actual DATA_OUT[0:M] with an expected DATA_OUT[0:M].

Transition delay faults can falsely cause the integrated circuit 102 to fail testing. Transition delay faults are caused by the finite rise and fall times of signals at logic gates and the propagation delay of interconnects between the logic gates. The clock signals CLK_IN[0:N] and CLK_OUT[0:M] have the same transition type, i.e. a positive edge transition type where logic gates are triggered on a rising edge or negative edge transition type where logic gates are triggered on a falling edge. A misalignment of any of the edges of the internal clock signals CLK_IN[0:N] and CLK_OUT[0:M] can result in the circuit testing apparatus missing transition delay faults in logic circuits 106 that may not be detected if the positive edges of clock signals CLK_IN[0:N] and CLK_OUT[0:M] are misaligned. Such transition delay faults are referred to as "inter-clock transition delay faults."

SUMMARY OF THE INVENTION

In one embodiment, an apparatus includes an integrated circuit, and the integrated circuit includes logic circuits and data gates, coupled to an input and an output of each of the logic circuits, to receive and store data to be released to and from the logic circuits. The integrated circuit also includes a synchronous clock edge alignment system coupled to the data gates. The synchronous clock edge alignment system is configured to determine when synchronous clock signal edges of a same transition type are aligned, wherein at least two of the clock signals have different frequencies and the clock signals are internal to the integrated circuit. The synchronous clock edge alignment system is further configured to provide gated clock signals to the data gates to release the stored data to and from the logic circuits when the edges of the clock signals are aligned. The synchronous clock edge alignment system is also configured to release the data into and out of the logic circuits to increase detection of transition delay faults in the logic circuits relative to detection of transition delay faults in the logic circuits that occur when the data is released and the edges of the clock signals are not aligned.

In another embodiment, a method of increasing detection coverage of inter-clock transition delay faults includes determining when synchronous clock signal edges of a same transition type are aligned, wherein at least two of clock signals of an integrated circuit have different frequencies and the clock signals are internal to an integrated circuit. The method also includes providing gated clock signals to logic circuits in the integrated circuit to release data into and out of the logic circuits when the edges of the clock signals are aligned. The method further includes releasing the data into and out of the logic circuits to increase detection of transition delay faults in the logic circuits relative to detection of transition delay faults in the logic circuits that occur when the data is released and the edges of the clock signals are not aligned.

In a further embodiment, an apparatus includes an integrated circuit. The integrated circuit includes logic circuits and data gates, coupled to an input and an output of each of the logic circuits, to receive and store data to be released to and from the logic circuits. The integrated circuit further includes a synchronous clock edge alignment system coupled to the data gates. The synchronous clock edge alignment system is configured to receive clock signals to control release of the data to and from the logic circuits, wherein the clock signals are synchronous and have at least two frequencies and determine when edges of the clock signals are aligned. The synchronous clock edge alignment system is further configured to determine a least common multiple (LCM) value of a number of pulses of the clock signals that occur between a previous alignment of the pulses of the clock signals and a next alignment of the edges of the pulses of the clock signals and save the LCM value. The synchronous clock edge alignment system is also configured to determine when the LCM value minus one equals a number of pulses of a master clock signal, wherein the master clock signal controls overall timing of the synchronous clock edge alignment system. The synchronous clock edge alignment system is additionally configured to release input gated clock signals from the data gates coupled to the input of the logic circuits to input data into the logic circuits and concurrently release output gated clock signals from the data gates coupled to the output of the logic circuits to output data from the logic circuits.

In an additional embodiment, a method includes receiving clock signals to control release of data to and from the logic circuits of an integrated circuit, wherein the clock signals are synchronous and have at least two frequencies, wherein data gates, coupled to an input and an output of each of the logic circuits, to receive and store data to be released to and from the logic circuits. The method also includes determining when edges of the clock signals are aligned and determining a least common multiple (LCM) value of a number of pulses of the clock signals that occur between a previous alignment of the pulses of the clock signals and a next alignment of the edges of the pulses of the clock signals. The method further includes saving the LCM value and determining when the LCM value minus one equals a number of pulses of a master clock signal, wherein the master clock signal controls overall timing of a synchronous clock edge alignment system. The method additionally includes releasing input gated clock signals from the data gates coupled to the input of the logic circuits to input data into the logic circuits and concurrently release output gated clock signals from the data gates couple

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
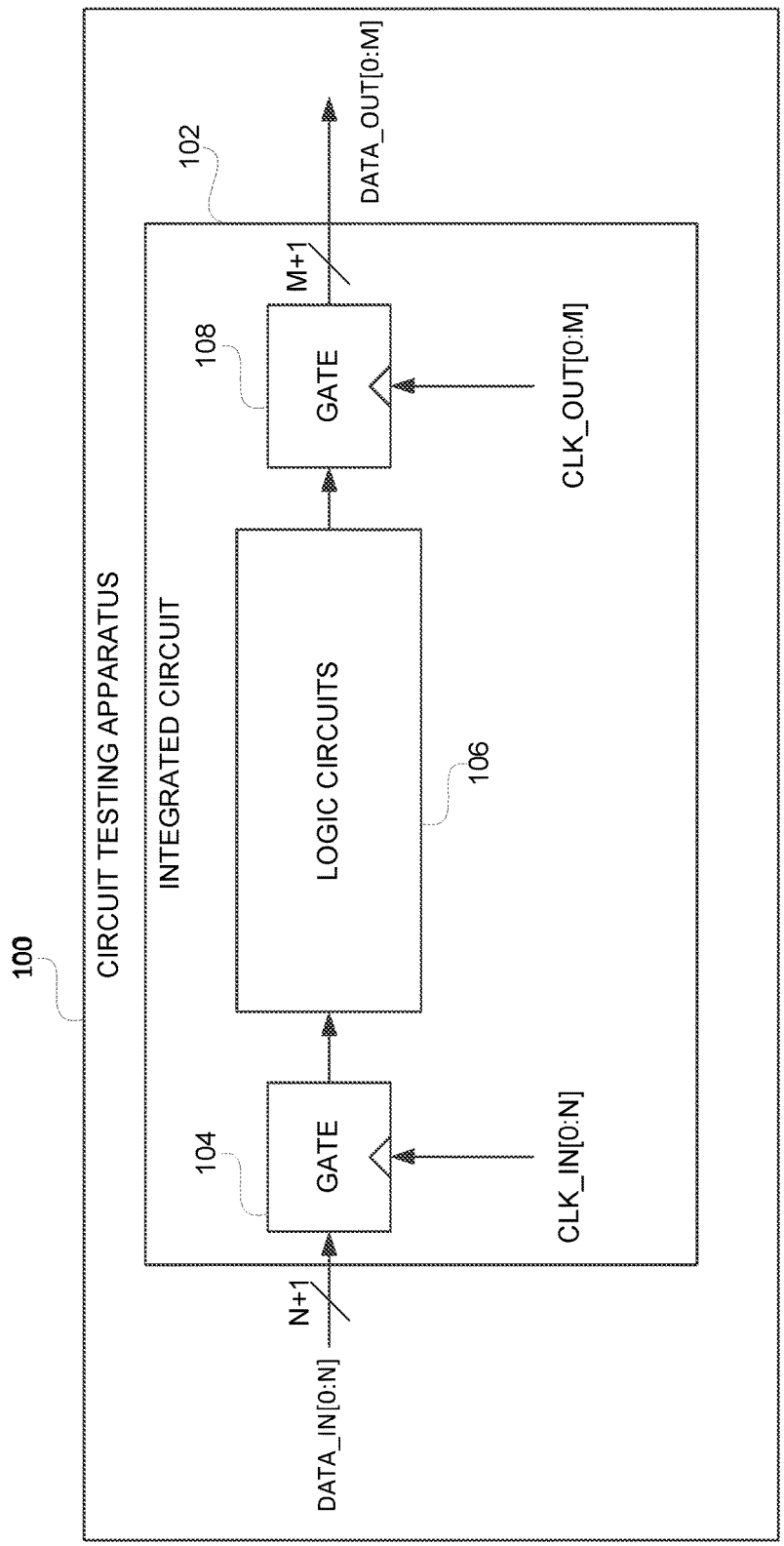
FIG. 1 (labeled prior art) depicts circuit testing apparatus for testing an integrated circuit.

In at least one embodiment, a synchronous clock edge alignment system and method increases detection coverage of transition delay faults that occur in logic circuits that have data released by a clock at an input of logic circuits internal to an integrated circuit and/or released at the output of the logic circuits when testing an integrated circuit. ("Internal" refers to signals or circuits internal to the integrated circuit.) Increasing detection coverage of inter-clock transition delay faults refers to increasing the detection of transition delay faults that occur in the logic circuits that have data that is released into (also referred to as "clocked in") the logic circuits and released out of (also referred to as "clocked out") the logic circuits. The problem of detecting inter-clock transition delay faults increases when the clock signals have multiple frequencies and the edges of the same type are misaligned when the data is released in or out. To increase detection coverage of inter-clock transition delay faults, in at least one embodiment, the synchronous clock edge alignment system and method align same transition type edges, either positive or negative, of internal data releasing clock signals, and at least two of the clock signals have different frequencies. By aligning the edges of the clock signals, transition delay faults that might otherwise not have occurred can be detected by, for example, a conventional circuit testing apparatus. Thus, aligning the edges of the clock signals increases detection of inter-clock transition delay faults.

In at least one embodiment, the synchronous clock edge alignment system and method process the clock signals to determine a least common multiple of pulses of a master clock that occur between each alignment of positive or negative edges of the clock signals. Thus, each alignment is identified and used to release clock signals, which release data into and out of the logic circuits for testing. Exemplary transition types are a positive edge transition type where gates are triggered on a rising edge or negative edge transition type where gates are triggered on a falling edge. In at least one embodiment, the synchronous clock edge alignment system and method utilize existing clock gates and clock paths so that non-testing operational clock paths are unaffected by the synchronous clock edge alignment system and method.

In at least one embodiment, the synchronous clock edge alignment system and method determine when synchronous clock signal edges of a same transition type are aligned. When the edges are determined to be aligned, the synchronous clock edge alignment system and method enable the clock signals to be provided to circuits in the integrated circuit. In at least one embodiment, the synchronous clock edge alignment system and method include a least common multiple calculation and learning circuit to determine a least common multiple value of a number of pulses of the master clock signal between instances of when the edges of the clock signals are aligned and enable the clock signals to be provided to logic circuits in the integrated circuit when a current number of pulses of the master clock since an immediately preceding occurrence of an alignment of the clock signals is equal to the least common multiple value. In at least one embodiment, the synchronous clock edge alignment system and method also include clock enable signal generation logic that utilizes the least common multiple value to determine when the clock signal edges are aligned and thereby determine when to release clock signals to circuit logic of the integrated circuit. In at least one embodiment, by aligning the clock signal edges, the synchronous clock edge alignment system and method increase coverage of inter-clock transition delay faults and, thus, improve the accuracy of integrated circuit functional testing.

Figure 2:
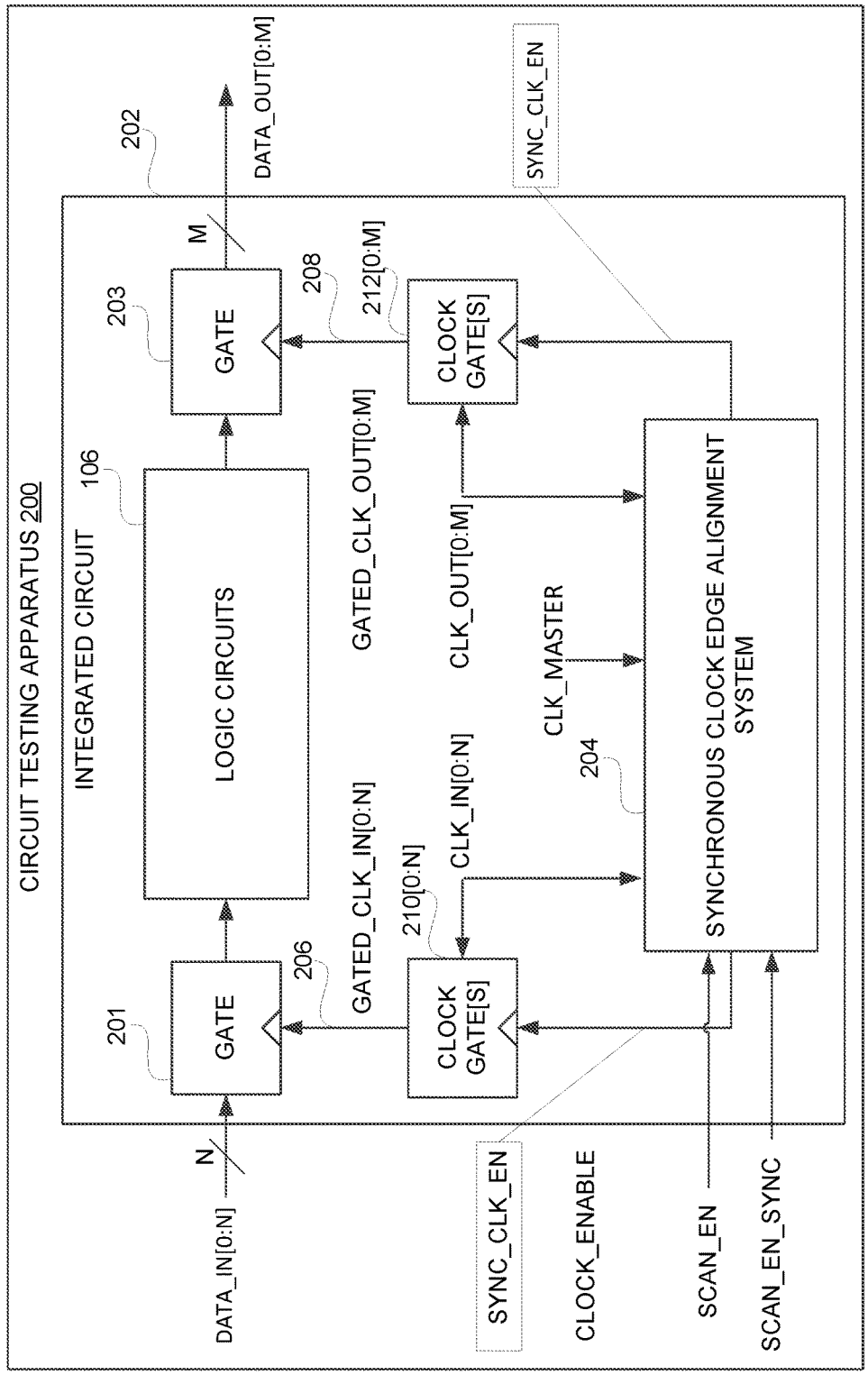
FIG. 2 depicts a circuit testing apparatus for testing integrated circuit that includes a synchronous clock edge alignment system.

FIG. 2 depicts a circuit testing apparatus 200 for testing integrated circuit 202. In at least one embodiment, circuit testing apparatus 200 is the same as circuit testing apparatus 100. The integrated circuit 202 includes a synchronous clock edge alignment system 204 that determines when edges of synchronous clock signals CLK_IN[0:N] and CLK_OUT[0:M] of the same transition type are aligned. A master clock signal CLK_MASTER controls overall timing of the synchronous clock edge alignment system 204. As subsequently described in more detail, the synchronous clock edge alignment system 204 receives and utilizes the circuit testing apparatus 200 generated signals SCAN_EN and SCAN_EN_SYNC to time the edge alignment calculations and release of clock signals CLK_IN[0:N] and CLK_OUT[0:M] by respective clock gates 210[0:N] and 212[0:M].

At least two of the clock signals CLK_IN[0:N] and CLK_OUT[0:M] have different frequencies, and the synchronous clock signals CLK_IN[0:N] and CLK_OUT[0:M] are internal to the integrated circuit 202. In at least one embodiment, at least two clock signals are used to respectively control provision of input data and output data to a particular logic circuit have different frequencies. When the edges of clock signals CLK_IN[0:N] and CLK_OUT[0:M] are aligned, the synchronous clock edge alignment system 204 enables respective clock gates 210[0:N] and 212[0:M] to provide the gated clock signals GATED_CLK_IN[0:N] and GATED_CLK_OUT[0:M] to be provided to respective data gates 201 and 203. Gates 201 and 203 are circuits, such as a D-flip flop or any other circuit that hold respective DATA_IN[0:N] and DATA_OUT[0:M] until receiving a pulse of respective clock signals CLK_IN[0:N] and CLK_OUT[0:M]. The gated clock signals GATED_CLK_IN[0:N] and GATED_CLK_OUT[0:M] are the released versions of respective clock signals CLK_IN[0:N] and CLK_OUT[0:M].

In at least one embodiment, when the edges of the same transition type, such as the positive edges or negative edges, of clock signals CLK_IN[0:N] and CLK_OUT[0:M] are aligned, the synchronous clock edge alignment system 204 generates a SYNC_CLK_EN signal and asserts the SYNC_CLK_EN signal on control terminals of the clock gate(s) 210[0:N] and 212[0:M]. When the synchronous clock edge alignment system 204 asserts the SYNC_CLK_EN signal, the clock gate(s) 210[0:N] and 212[0:M] provide the gated clock signals GATED_CLK_IN[0:N] and GATED_CLK_OUT[0:M] to control terminals of the respective data gates 201 and 203. In at least one embodiment, data gates 201 and 203 are electronic circuits such as D-flip flops or any other circuit type that holds and releases respective DATA_IN[0:N] and DATA_OUT[0:M] until receiving a pulse of respective clock signals CLK_IN[0:N] and CLK_OUT[0:M]. When the gated clock signals GATED_CLK_IN[0:N] and GATED_CLK_OUT[0:M] are provided to data gate 201, the gated clock signals GATED_CLK_IN[0:N] and GATED_CLK_OUT[0:M] trigger data gate 201 to transfer DATA_IN[0:N] to the logic circuits 106, and data gate 203 transfers the DATA_OUT[0:M] to circuit testing apparatus 201. In at least one embodiment, the circuit testing apparatus 200 then compares the DATA_OUT[0:M] with the corresponding DATA_IN[0:N] to determine if the integrated circuit functions properly. In at least one embodiment, the synchronous clock edge alignment system 204 is functional only during testing of the integrated circuit 202. Thus, synchronous clock edge alignment system 204 aligns the edges of the same transition type of clock signals CLK_IN[0:N] and CLK_OUT[0:M] to increase detection coverage of inter-clock transition delay faults in the integrated circuit 202. In at least one embodiment, the clock signals CLK_IN[0:N] and CLK_OUT[0:M] and the gated clock signals GATED_CLK_IN[0:N] and GATED_CLK_OUT[0:M] utilize the same signal paths 206 and 208 that are used during normal operation of the integrated circuit 202.

Figure 3:
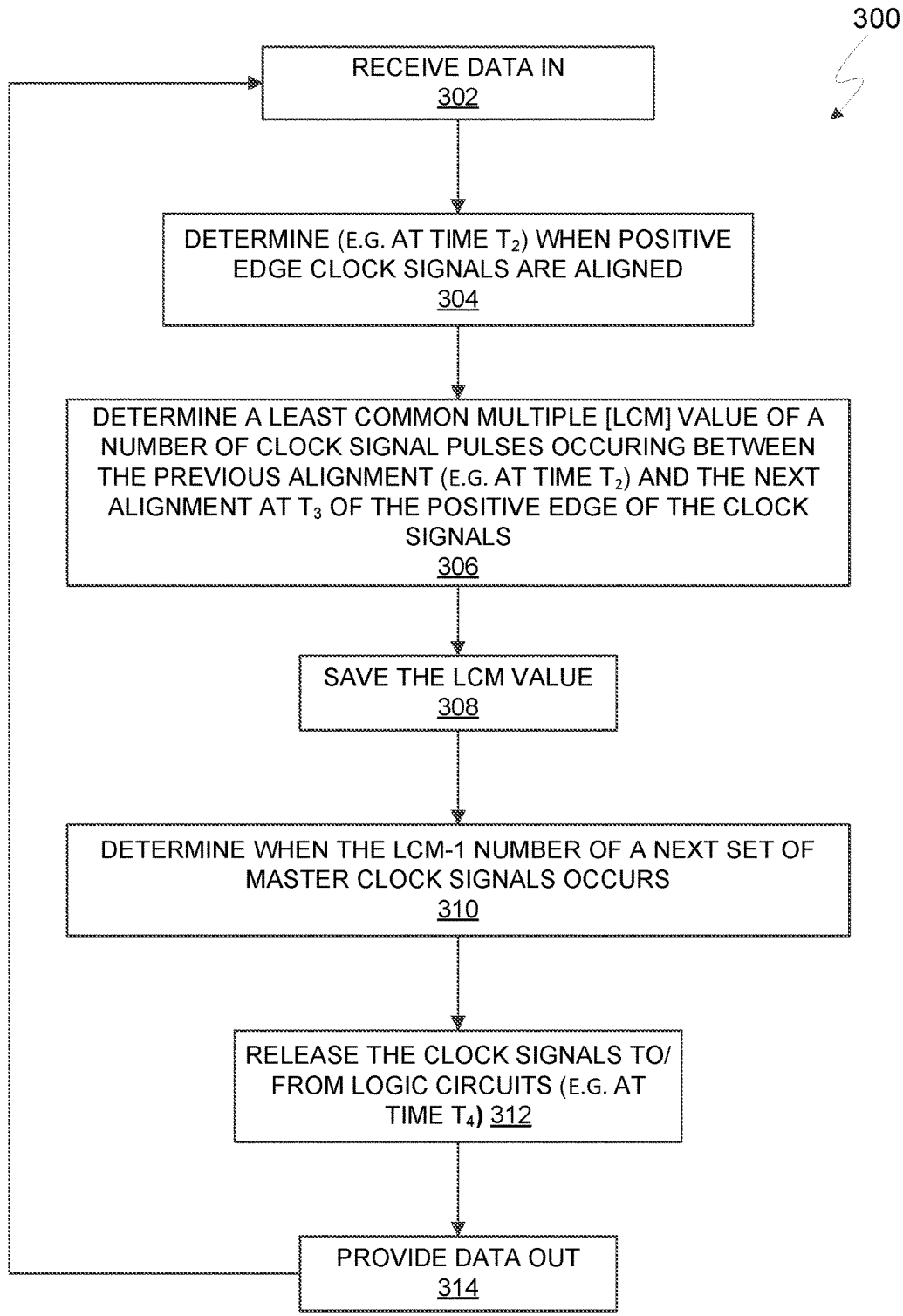
FIG. 3 depicts an exemplary synchronous clock edge alignment process utilized by the synchronous clock edge alignment system of FIG. 2.
Figure 4:
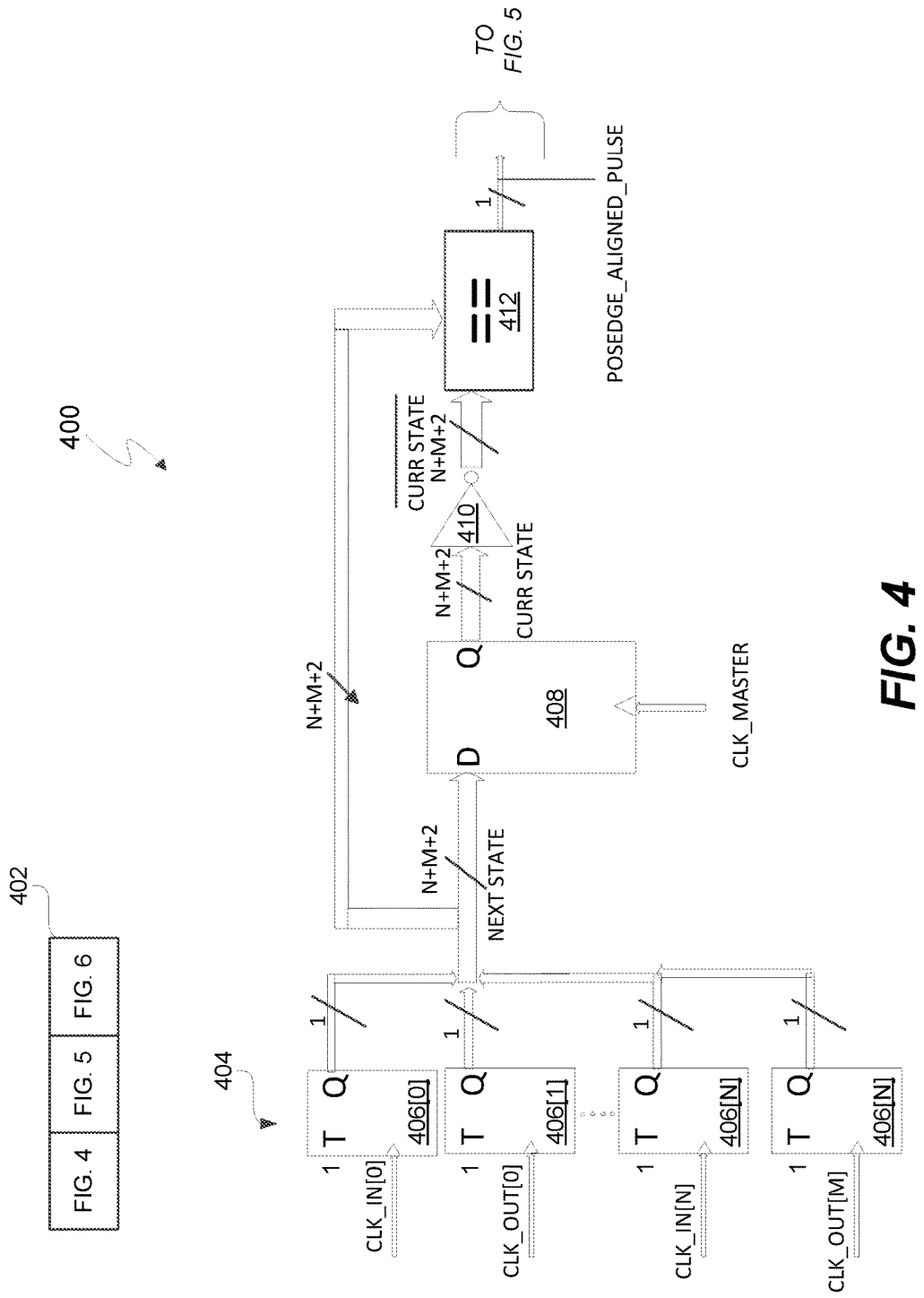
FIGS. 4-6 collectively form a composite depiction of a synchronous clock edge alignment circuit, which represents one embodiment of synchronous clock edge alignment system of FIG. 2.
Figure 5:
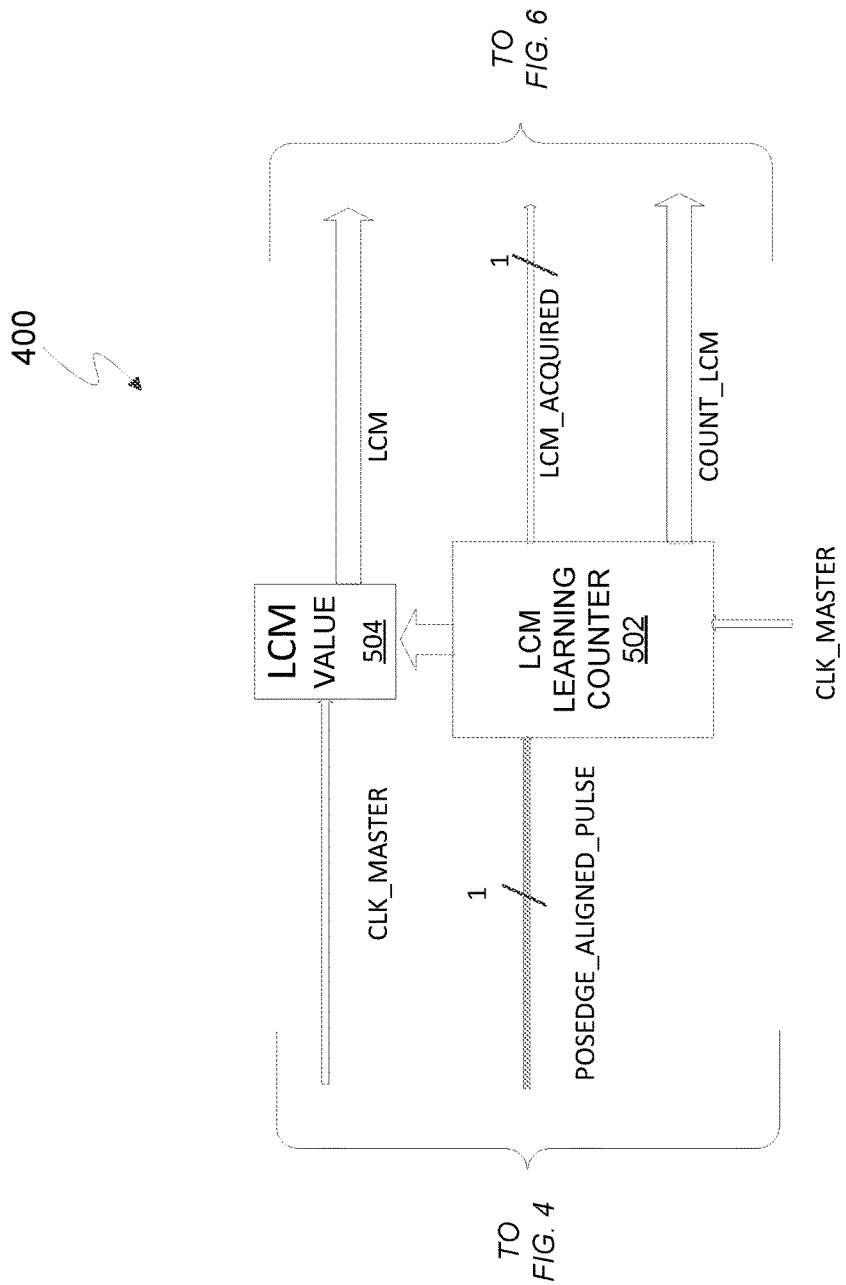
Figure 6:
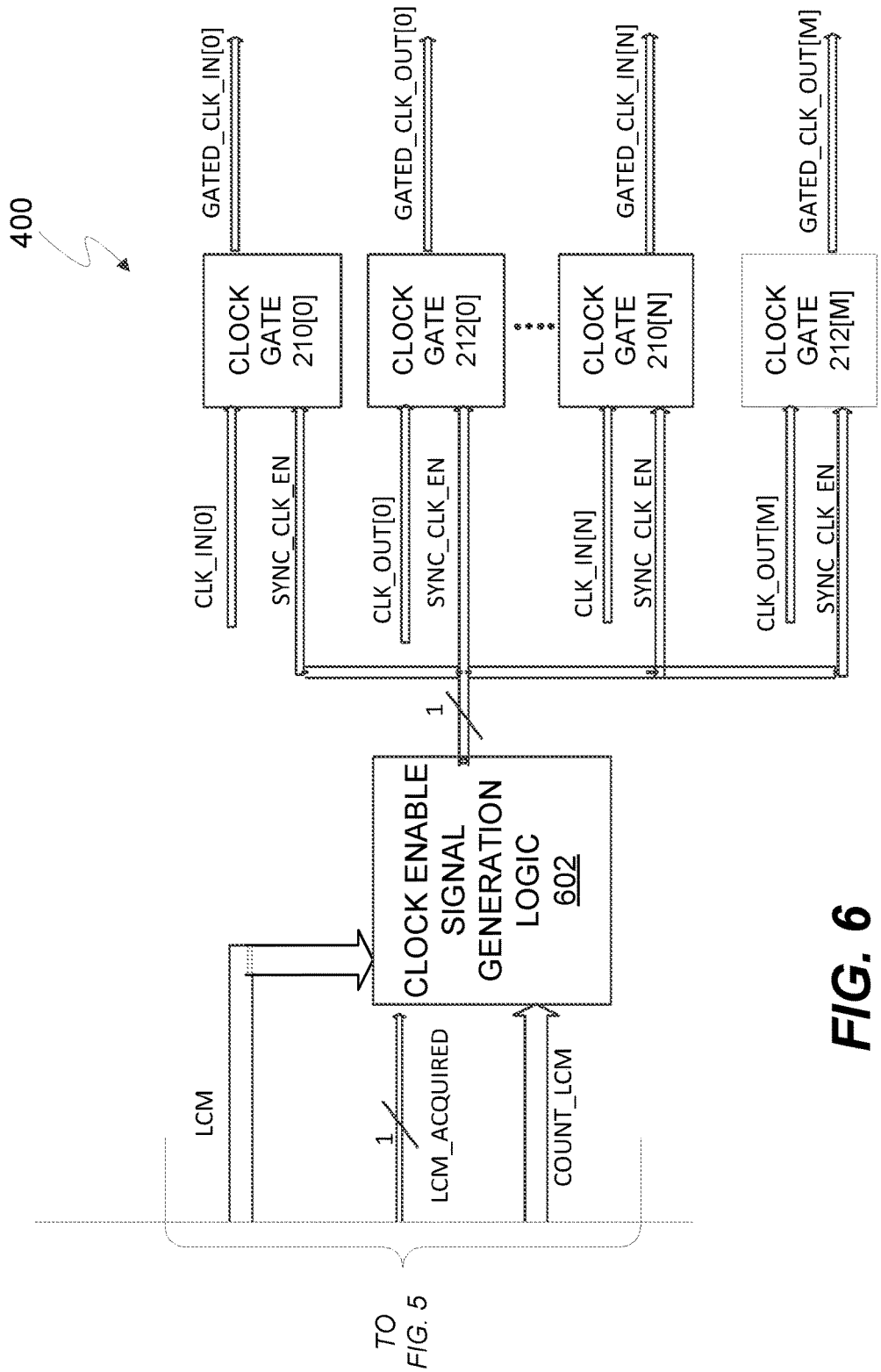
Figure 7:
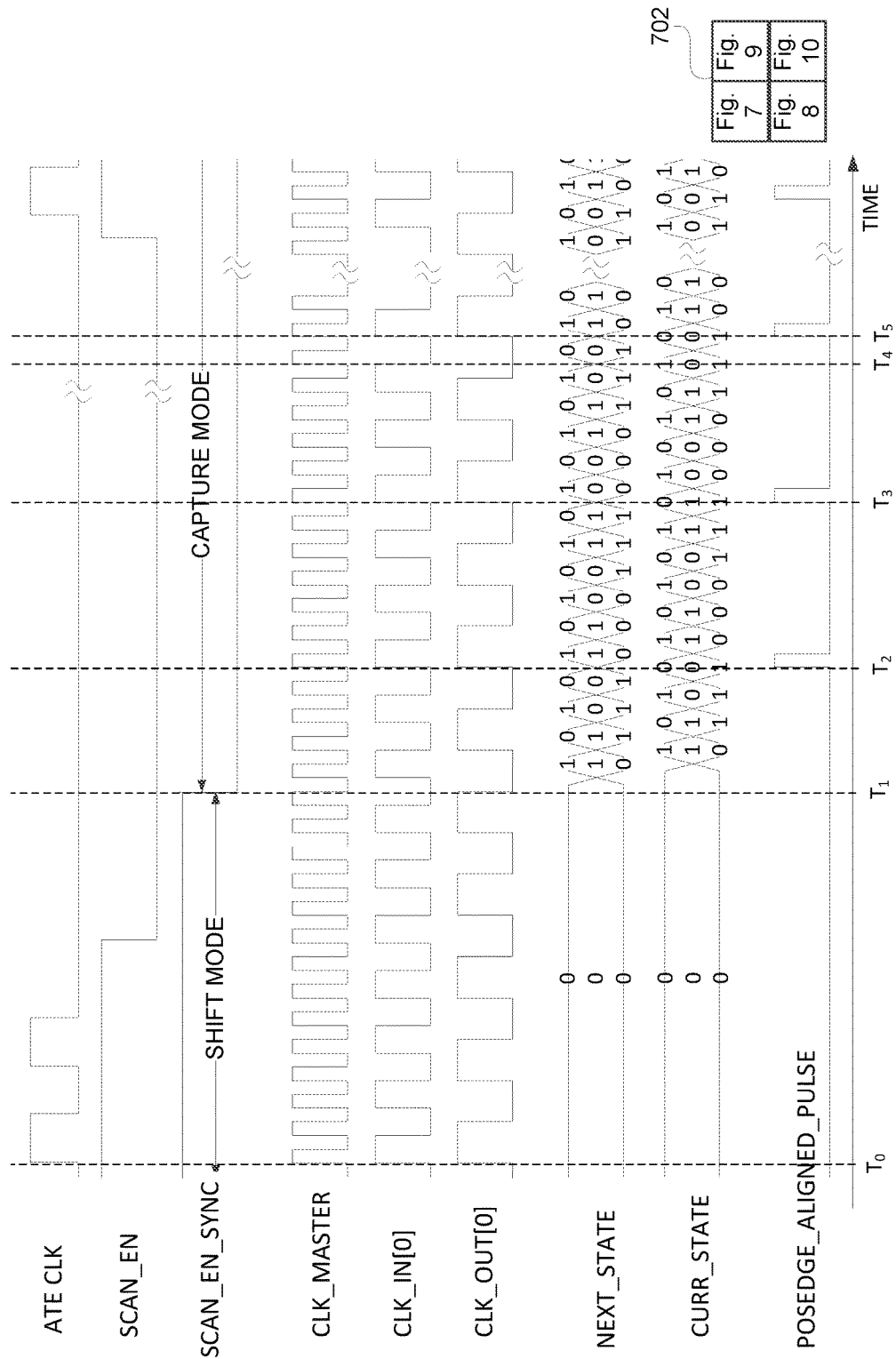
FIGS. 7-10 collectively depict exemplary timing diagrams corresponding to the synchronous clock edge alignment system of FIG. 2 and the synchronous clock edge alignment process of FIG. 3.
Figure 9:
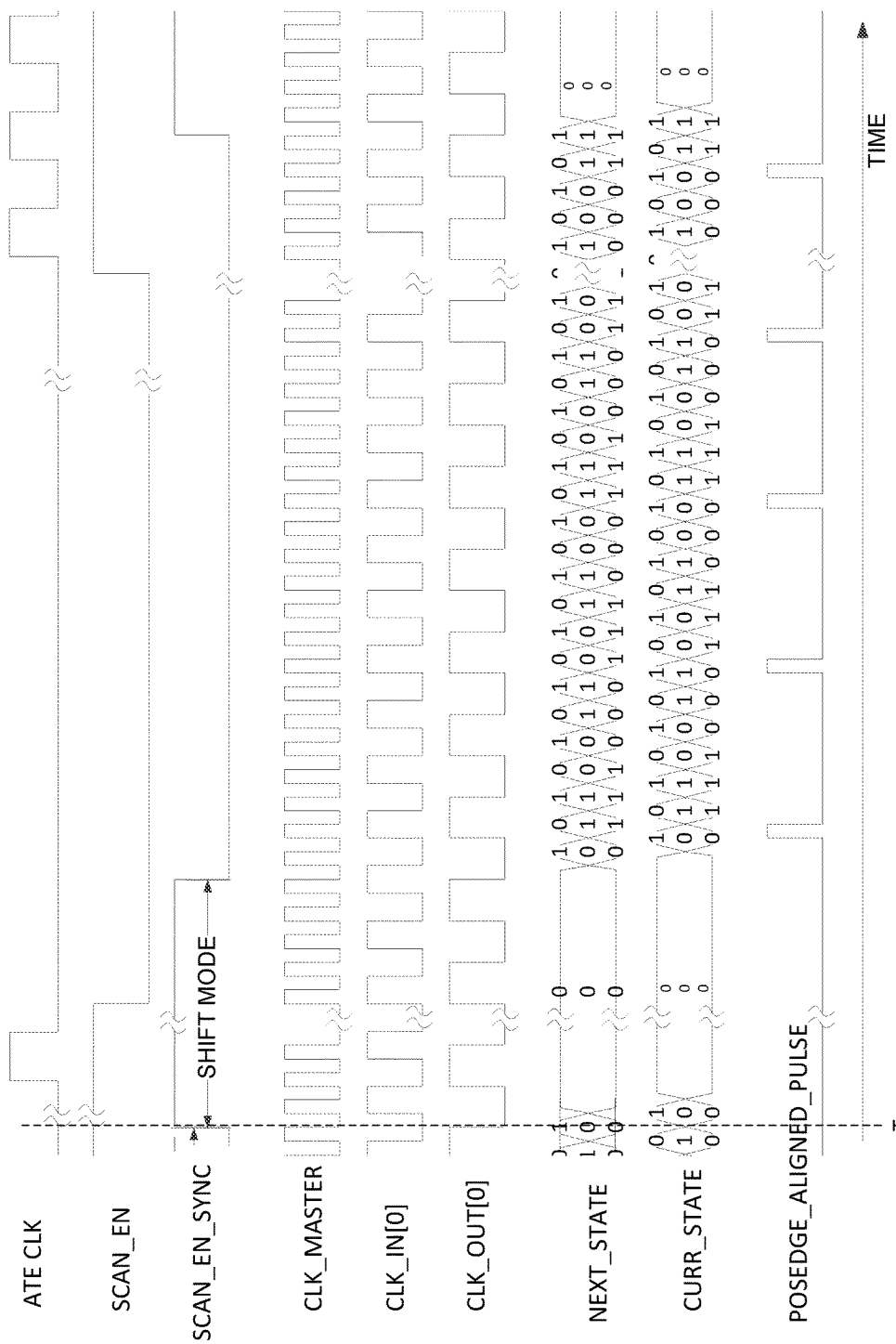
Figure 10:
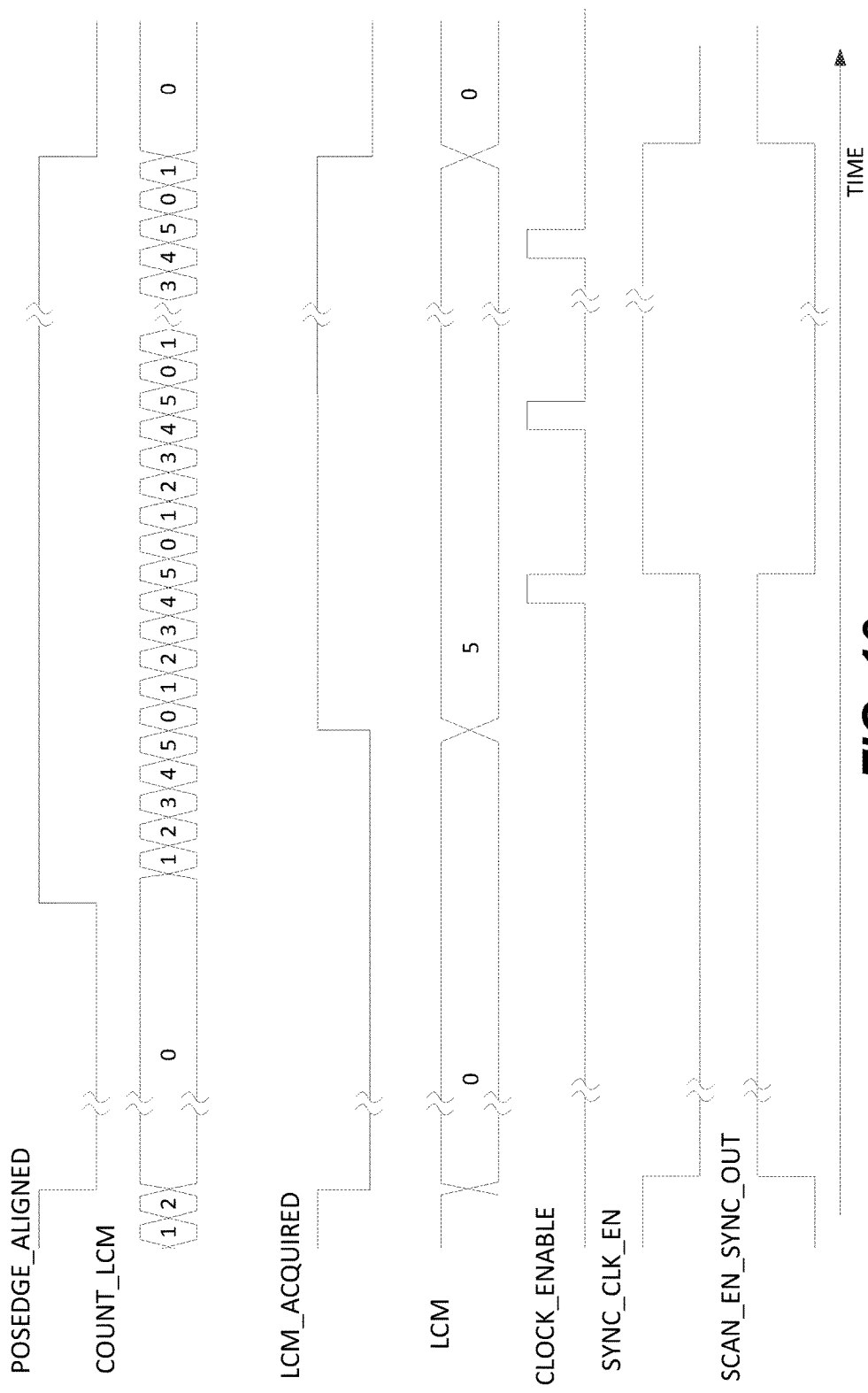

FIG. 3 depicts an exemplary synchronous clock edge alignment process 300 utilized by the synchronous clock edge alignment system 204. FIGS. 4-6 form a composite diagram, as indicated in the composite orientation legend 402, to collectively depict synchronous clock edge alignment circuit 400, which represents one embodiment of synchronous clock edge alignment system 204. The synchronous clock edge alignment circuit 400 operates in accordance with the synchronous clock edge alignment process 300. FIGS. 7-10 form a composite diagram, as indicated in the composite orientation legend 702, to collectively depict exemplary timing diagrams 700 corresponding to the synchronous clock edge alignment system 204 and the synchronous clock edge alignment process 300. FIG. 9 continues from FIG. 7 in time. FIG. 10 continues from FIG. 8 in time.

Referring to FIGS. 3-10, the following describes an illustrative, operational embodiment of synchronous clock edge alignment system 204 with exemplary signals and data. The circuit testing apparatus 200 has an internal clock signal ATE CLK (FIG. 7) and internal enable signals SCAN_EN and SCAN_EN_SYNC. In operation 302, when the SCAN_EN_SYNC signal is high, such as between times $T_0$ to $T_1$, and in response to pulses of the clock signal ATE CLK of circuit testing apparatus 200, the circuit testing apparatus 200 is in shift mode. While in shift mode, the circuit testing apparatus 200 shifts DATA_IN[0:N] into data gate 201. The SCAN_EN signal indicates entry into an upcoming data capture mode of DATA_IN[0:N] and initialization of the synchronous clock edge alignment process 300 for a current set of DATA_IN[0:N] and DATA_OUT[0:M]. When the SCAN_EN_SYNC signal transitions to low, such as at time $T_1$, the logic circuits 106 enter a capture mode to receive and process the DATA_IN[0:N] and generate the DATA_OUT[0:M].

Referring to FIGS. 3, 4-6, and 7-10, operation 304 begins at the beginning of each capture mode, such as at time $T_1$, and ends at the beginning of the next shift mode, such as at time $T_6$. In operation 304, the synchronous clock edge alignment system 204 determines a time $T_2$ when the positive edges of clock signals CLK_IN[0:N] and CLK_OUT[0:M] are aligned. Although FIGS. 7-10 depict only three clock signals, i.e. master clock signal CLK_MASTER, clock signal CLK_IN[0], and clock signal CLK_OUT[0], the following description applies the same to any number of clock signals CLK_IN[0:N] and CLK_OUT[0:M].

The synchronous clock edge alignment system 204 includes a T-flip flop bank 1404 of T-flip flops 1406[0:N] that represent one embodiment of data gate 201. In at least one embodiment, each of T-flip flops 1406[0:N] is used in a straight inversion mode of a T-flip flop. In at least one embodiment, the respective T inputs of the T-flip flops 1404 is held at a logical "1" (as shown). In at least one embodiment, the respective T inputs of the T-flip flops 1404 is held at a logical "0". The NEXT_STATE signals (FIG. 7) represent the values at the Q output terminals of all the T-flip flops 1404 when clocked by respective clock signals CLK_IN[0:N] and CLK_OUT[0:M]. The NEXT_STATE signal values are input to the N+1 inputs of a bank of D-flip flops 408, and the D-flip flops 408 generate current state output data CURR_STATE upon each pulse of the master clock signal CLK_MASTER. The clock signals CLK_IN[0:N] and CLK_OUT[0:M] are synchronous, i.e. the edges of each clock signal CLK_IN[0:N] and CLK_OUT[0:M] will align at some point in time. At least two of the clock signals, master clock signal CLK_MASTER, clock signals CLK_IN[0:N], and CLK_OUT[0:M], have different frequencies. For example, the ratio of frequencies of exemplary clock signals CLK_MASTER, CLK_IN[0], CLK_OUT[0], and CLK_IN[N] is 1:2:3:1. (The clock signals CLK_IN[1:M] and CLK_OUT[1:M] are identical to respective clock signals CLK_IN[0], CLK_OUT[0] and are not repeated in FIG. 4 for conciseness.)

To determine the alignment of the positive edges of clock signals CLK_IN[0:N] and CLK_OUT[0:M], inverter bank 410 inverts the values of the CURR_STATE signals, and comparator 412 determines when the inverted values of the CURR_STATE signals equal the corresponding values of the NEXT_STATE signals, i.e. CURR_STATE[0]=NEXT_STATE[0], CURR_STATE[1]=NEXT_STATE[1], . . . CURR_STATE[N]=NEXT_STATE[N]. When the comparator 412 determines the values of the CURR_STATE[N+M+2] signals equal the corresponding values of the NEXT_STATE signals, the comparator 412 generates a pulse of comparator output signal POSEDGE_ALIGNED_PULSE.

In operation 306, the synchronous clock edge alignment system 204 determines a least common multiple (LCM) value of a number of pulses of CLK_IN[0:N] that occur from the positive edge alignment of clock signals CLK_IN[0:N]. Referring to FIGS. 3-5 and 8, the synchronous clock edge alignment system 400 includes a LCM learning counter 502. The LCM learning counter 502 begins counting a number of pulses of the master clock signal CLK_MASTER that occur from reception of a pulse of the comparator output signal POSEDGE_ALIGNED_PULSE, such as time $T_2$ (FIG. 7), until receipt of a next pulse of the comparator output signal POSEDGE_ALIGNED_PULSE, such as at time $T_3$. The LCM learning counter 502 internally generates the count signal COUNT_LCM (FIG. 8), which begins at count COUNT_LCM equal 0 and progresses until receipt of a next pulse of the comparator output signal POSEDGE_ALIGNED_PULSE. For example, in the exemplary timing diagram of FIG. 8, the LCM value is 6, i.e. the value of COUNT_LCM began at 0 and ended at 5, so the LCM value is 5+1).

In operation 308, the LCM learning counter 502 stores the LCM value in memory 504. The LCM learning counter 502 also transitions a signal LCM_ACQUIRED from low to high at time $T_3$, when the LCM value was acquired. The signal LCM_ACQUIRED remains high until the scan enable SCAN_EN transitions from high to low. The LCM learning counter 502 provides the LCM value and signals LCM_ACQUIRED and COUNT_LCM to a clock enable signal generation logic 602 (FIG. 6). In at least one embodiment, the LCM learning counter 502 is implemented using a standard counter and an incrementing register (not shown) that stores the LCM count value when at each pulse of the signal POSEDGE_ALIGNED_PULSE.

Figure 8:
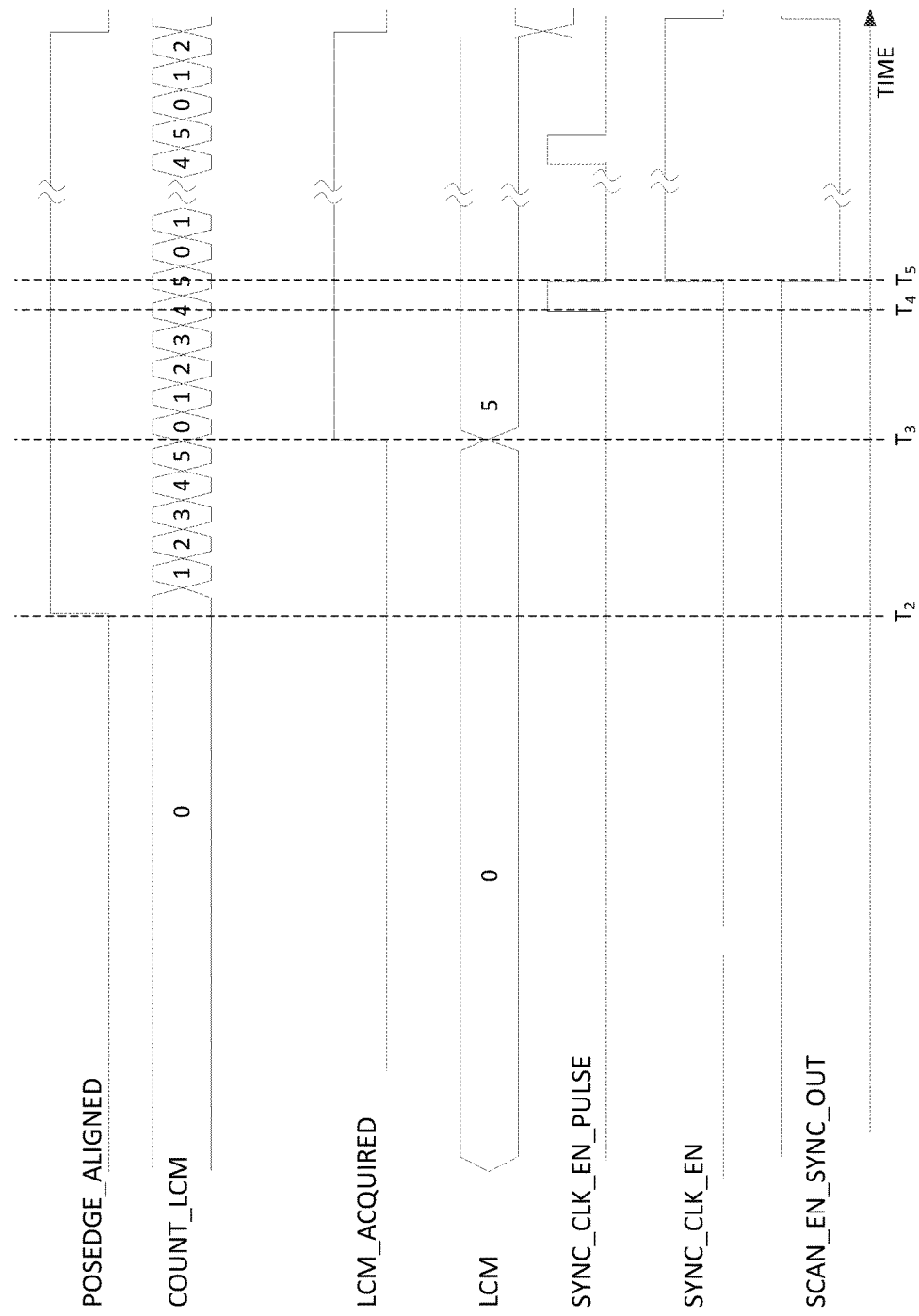

Referring to FIGS. 3, 6, and 8, clock enable signal generation logic 602 controls the generation of the SYNC_CLK_EN signal that releases the clock signals CLK_IN[0:N] from respective clock gates 210[0:N] and CLK_OUT[0:M] from respective clock gates 212[0:M] so that the positive edges of the clock signals GATED_CLK_IN[0:N] and GATED_CLK_OUT[0:M] are aligned. In operation 310, a high LCM_ACQUIRED signal activates the clock enable signal generation logic 602 to generate a SYNC_CLK_EN PULSE signal at time $T_4$ when the received value of the COUNT_LCM signal equals the received LCM value minus 1. The SYNC_CLK_EN PULSE signal causes the clock enable signal generation logic 602 to generate the SYNC_CLK_EN signal pulse at LCM minus 1 so that the SYNC_CLK_EN will release the clock signals CLK_IN[0:N] and CLK_OUT[0:M] as soon as the clock signals CLK_IN[0:N] and CLK_OUT[0:M] leading edges are aligned.

In operation 312, at time $T_5$ the pulse of the SYNC_CLK_EN signal is asserted at the clock gates 212[0:N] and 214[0:M] to release the clock signals CLK_IN[0:N] and CLK_OUT[0:M] as gated clock signals GATED_CLK_IN[0:N] and GATED_CLK_OUT[0:M] while the LCM value is acquired as indicated by the duration of the high LCM_ACQUIRED signal. Referring to FIG. 2, the gated clock signals GATED_CLK_IN[0:N] release the DATA_IN[0:N] from data gate 201 and into logic circuits 106.

The gated clock signals GATED_CLK_OUT[0:M] cause the data gate 203 in operation 314 to release and, thus, provide the DATA_OUT[0:M] from logic circuits 106 to the circuit testing apparatus 200. The synchronous clock edge alignment process 300 then repeats. In at least one embodiment, the clock enable signal generation logic 602 is implemented using logic gates that are are activated when the signal LCM_ACQUIRED indicates acquisition of the LCM value, and a comparator to compare the LCM value minus one with the number of master clock signal CLK_MASTER pulses indicated by the signal COUNT_LCM. The synchronous clock edge alignment circuit 400 utilizes SCAN_EN_SYNC OUT signal to trigger individual on chip clock controllers (not shown) for each internal clock) simultaneously.

Figure 12:
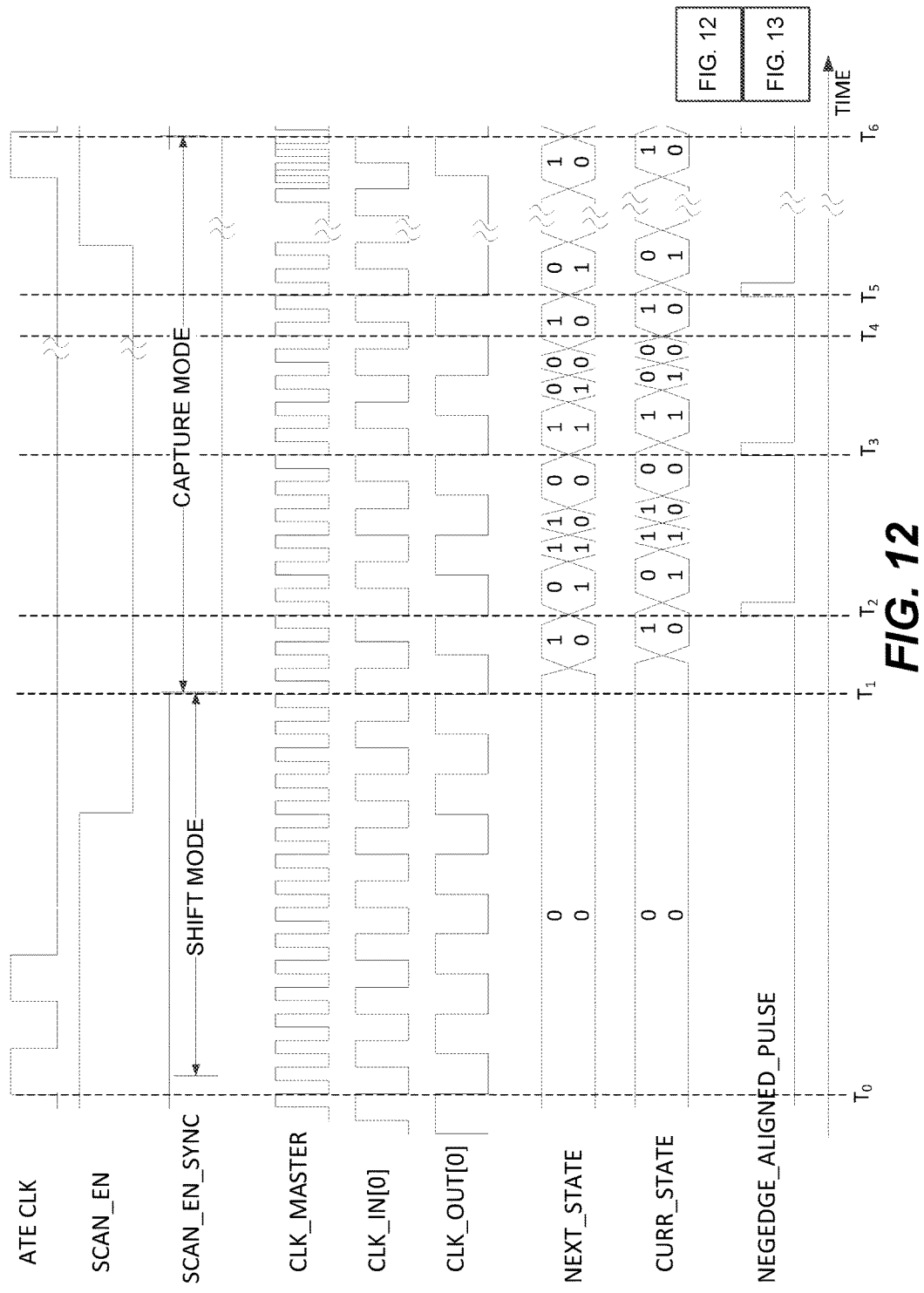
FIGS. 12-13 collectively depict exemplary timing diagrams corresponding to a negative edge embodiment of the synchronous clock edge alignment system of FIG. 11 and the synchronous clock edge alignment process of FIG. 3.
Figure 13:
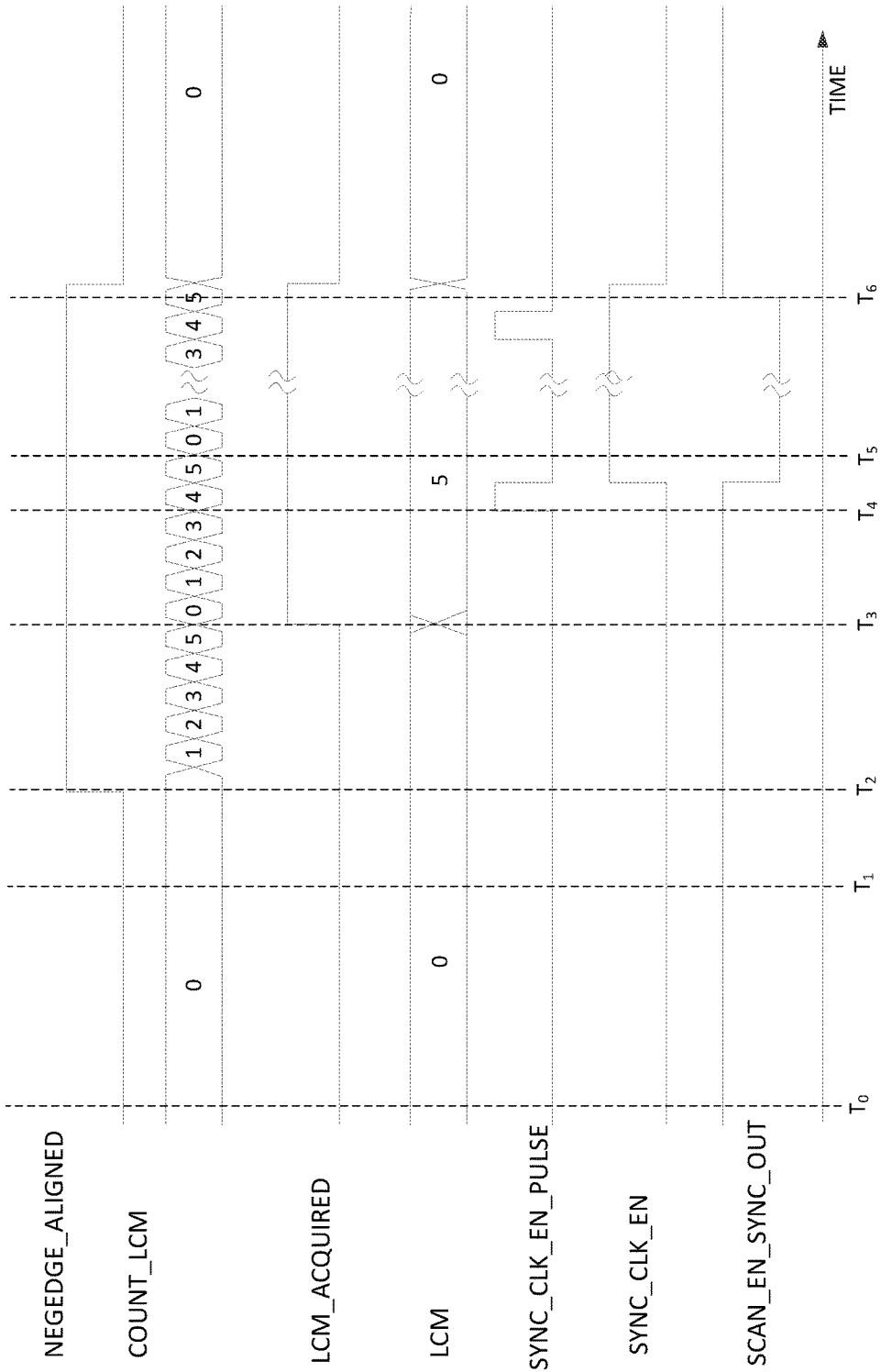
Figure 14:
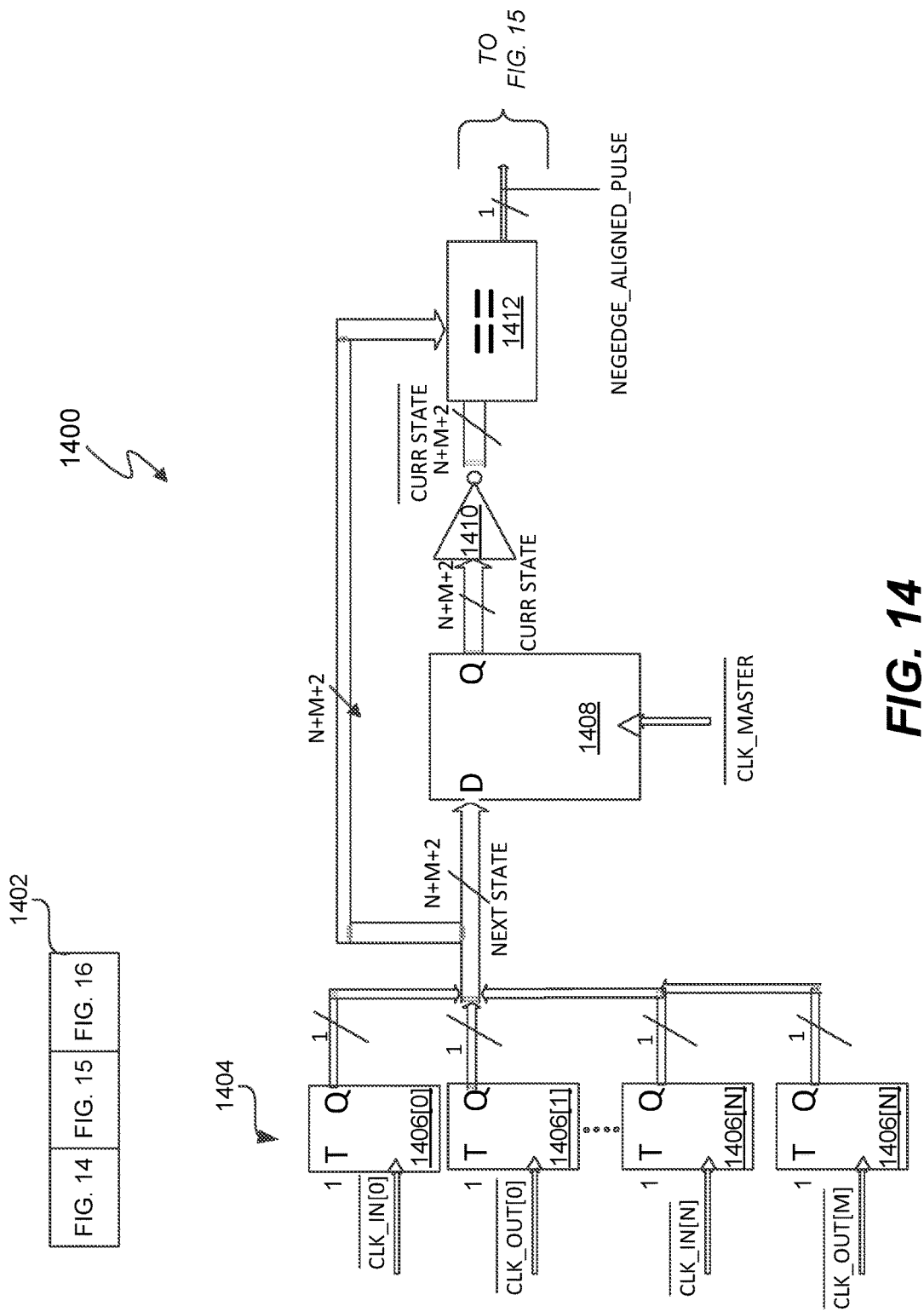
FIGS. 14-16 collectively form a composite depiction of a synchronous clock edge alignment circuit, which represents one embodiment of negative edge triggered, synchronous clock edge alignment system of FIG. 11.
Figure 15:
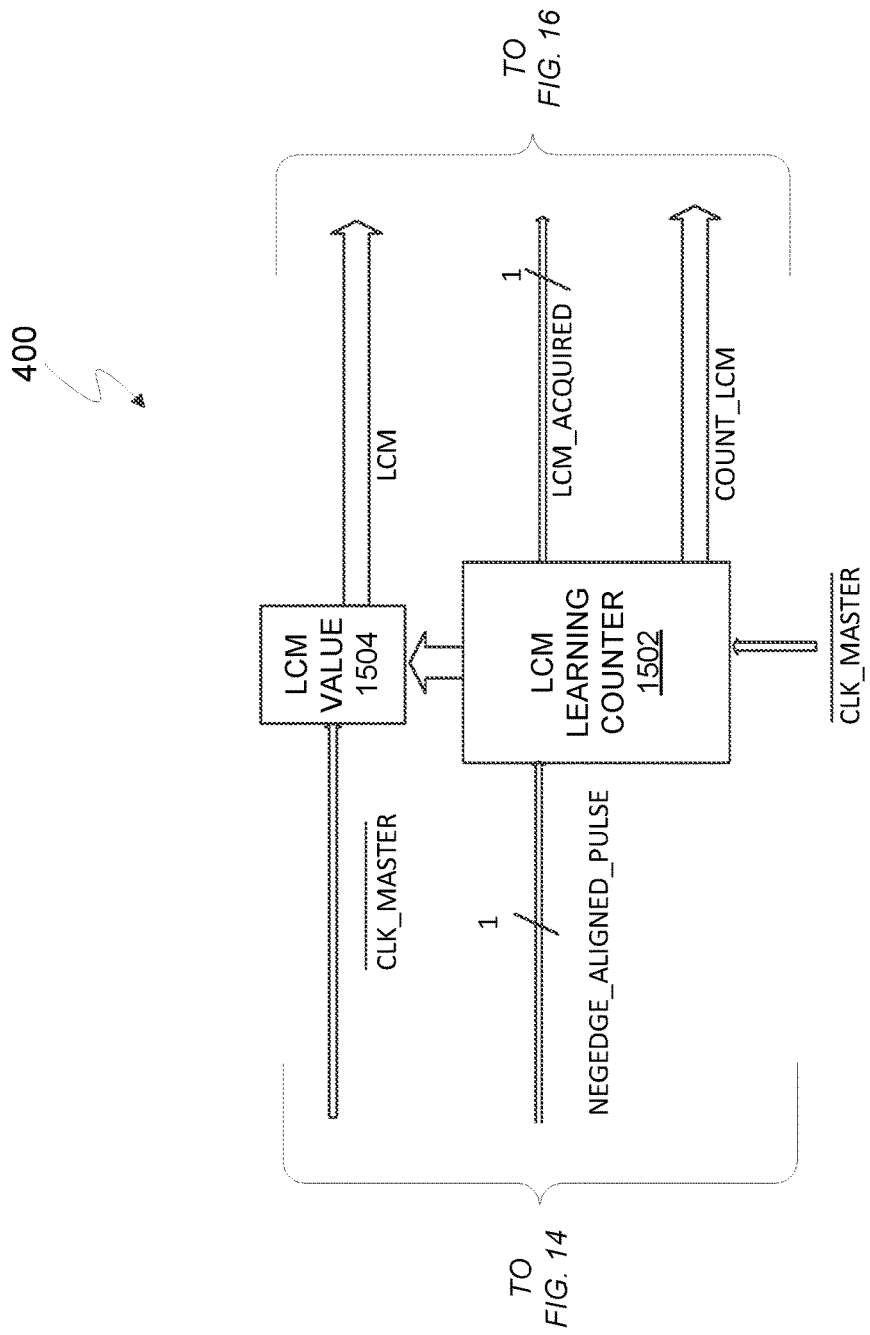
Figure 16:
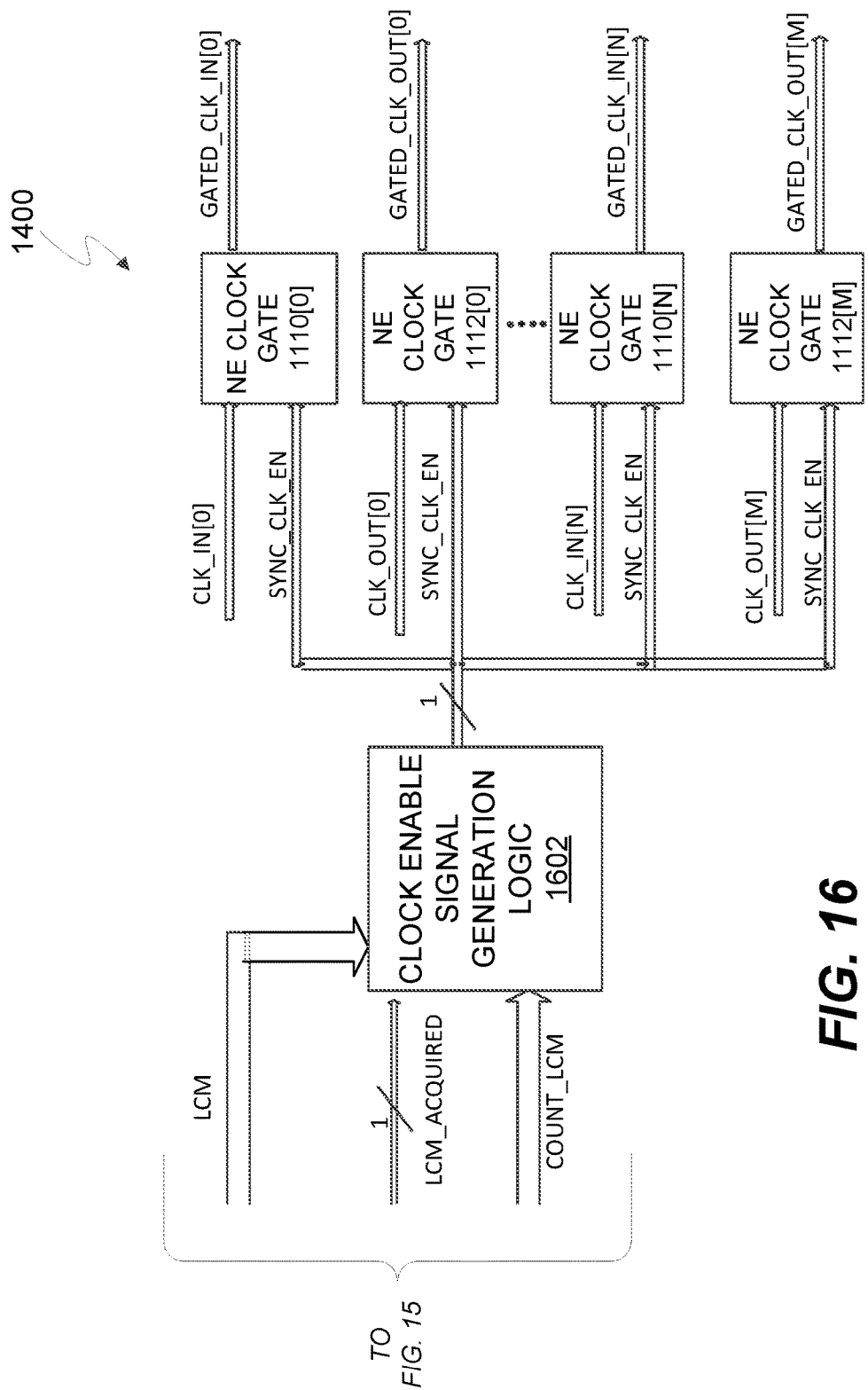

Referring to FIGS. 11-16, the synchronous clock edge alignment system 204 can also be implemented as synchronous clock edge alignment system 1104 to detect alignment of negative edges of the CLK_IN[0:N] and CLK_OUT[0:M] for negative edge triggered logic. The following describes an illustrative, operational embodiment of a negative edge triggered, synchronous, clock edge alignment system 1100 of FIG. 11 and embodiments thereof in conjunction with exemplary signals of FIGS. 12 and 13. FIGS. 14-16 collectively form a composite diagram as indicated in the composite orientation legend 1402 in FIG. 14. FIGS. 14-16 collectively depict synchronous clock edge alignment circuit 1400 with negative clock edge alignment, which represents one embodiment of synchronous clock edge alignment system 1104.

Referring to FIGS. 3 and 11-13, the circuit testing apparatus 1100 has an internal clock signal ATE CLK (FIG. 12) and internal enable signals SCAN_EN and SCAN_EN_SYNC. The exemplary synchronous clock edge alignment process 300 can also be utilized by the negative edge, synchronous clock edge alignment system 1102. In operation 302, when the SCAN_EN_SYNC signal is high, such as between times $T_0$ to $T_1$, and in response to pulses of the clock signal ATE CLK of circuit testing apparatus 1100, the circuit testing apparatus 1100 is in shift mode. While in shift mode, the circuit testing apparatus 1100 shifts DATA_IN[0:N] into data gate 201. The SCAN_EN signal indicates entry into an upcoming data capture mode of DATA_IN[0:N] and initialization of the synchronous clock edge alignment process 300 for a current set of DATA_IN[0:N] and DATA_OUT[0:M]. When the SCAN_EN_SYNC signal transitions to low, such as at time $T_1$, the logic circuits 106 enter a capture mode to receive and process the DATA_IN[0:N] and generate the DATA_OUT[0:M].

Operation 304 begins at the beginning of each capture mode, such as at time $T_1$, and ends at the beginning of the next shift mode, such as at time $T_6$. In operation 304, the synchronous clock edge alignment system 1104 determines a time $T_2$ when the negative edges of clock signals CLK_IN [0:N] and CLK_OUT[0:M] are aligned. Although FIGS. 12-13 depict only three clock signals, i.e. master clock signal CLK_MASTER, clock signal CLK_IN[0], and clock signal CLK_OUT[0], the following description applies the same to any number of clock signals CLK_IN[0:N] and CLK_OUT [0:M].

The synchronous clock edge alignment system 1400 (FIG. 14) includes a T-flip flop bank 1404 of T-flip flops 406[0:N] that represent one embodiment of data gate 201. In at least one embodiment, each of T-flip flops 1406[0:N] is used in a straight inversion mode of a T-flip flop. In at least one embodiment, the respective T input of the T-flip flops 1404 is held at a logical "1" (as shown). In at least one embodiment, the respective T inputs of the T-flip flops 404 is held at a logical "0". The NEXT_STATE signals represent the values at the Q output terminals of all the T-flip flops 404 when clocked by respective inverted clock signals $\overline{\text{CLK\_IN}[0:N]}$ and $\overline{\text{CLK\_OUT}[0:M]}$. The NEXT_STATE signal values are input to the N+1 inputs of a bank of D-flip flops 1408, and the D-flip flops 1408 generate current state output data CURR_STATE upon each pulse of the master clock signal CLK_MASTER.

The clock signals CLK_IN[0:N] and CLK_OUT[0:M] are synchronous, i.e. the negative edges of each clock signal CLK_IN[0:N] and CLK_OUT[0:M] will align at some point in time. At least two of the clock signals master clock signal CLK_MASTER, clock signal CLK_IN[0:N], and clock signal CLK_OUT[0:M] have different frequencies. For example, the ratio of frequencies of exemplary clock signals CLK_MASTER, CLK_IN[0], CLK_OUT[0], and CLK_IN [N] is 1:2:3:1. (The clock signals CLK_IN[1:M] and CLK_OUT[1:M] are identical to respective clock signals CLK_IN[0], CLK_OUT[0] and are not repeated in FIG. 12 for conciseness.)

To determine the alignment of the negative edges of clock signals CLK_IN[0:N] and CLK_OUT[0:M], inverter bank 1410 inverts the values of the CURR_STATE signals, and comparator 1412 determines when the inverted values of the CURR_STATE signals equal the corresponding values of the NEXT_STATE signals (FIG. 12), i.e. $\overline{\text{CURR\_STATE}[0]}$=NEXT_STATE[0], $\overline{\text{CURR\_STATE}[1]}$=NEXT_STATE[1], . . . $\overline{\text{CURR\_STATE}[N]}$=NEXT_STATE[N]. When the comparator 1412 determines the values of the $\overline{\text{CURR\_STATE}[N+M+2]}$ signals equal the corresponding values of the NEXT_STATE signals, the comparator 1412 generates a pulse of comparator output signal NEGEDGE_ALIGNED_PULSE.

In operation 306, the synchronous clock edge alignment system 1104 determines a least common multiple (LCM) value of a number of pulses of CLK_IN[0:N] that occur from the negative edge alignment of clock signals CLK_IN [0:N]. Referring to FIGS. 3, 13, and 15, the synchronous clock edge alignment system 1400 includes a LCM learning counter 1502. The LCM learning counter 1502 begins counting a number of pulses of the master clock signal CLK_MASTER that occur from reception of a pulse of the comparator output signal NEGEDGE_ALIGNED_PULSE, such as time $T_2$ (FIG. 12), until receipt of a next pulse of the comparator output signal NEGEDGE_ALIGNED_PULSE, such as at time $T_3$.

The LCM learning counter 1502 internally generates the count signal COUNT_LCM (FIG. 13), which begins at count of COUNT_LCM equal 0 and progresses until receipt of a next pulse of the comparator output signal NEGEDGE_ALIGNED_PULSE. For example, in the exemplary timing diagram of FIG. 8, the LCM value is 6, i.e. the value of COUNT_LCM began at 0 and ended at 5, so the LCM value is 5+1). In operation 308, the LCM learning counter 1502 stores the LCM value in memory 1504. The LCM learning counter 1502 also transitions a signal LCM_ACQUIRED from low to high at time $T_3$, when the LCM value was acquired. The signal LCM_ACQUIRED remains high until the scan enable SCAN_EN transitions from high to low. The LCM learning counter 1502 provides the LCM value and signals LCM_ACQUIRED and COUNT_LCM to a clock enable signal generation logic 1602 (FIG. 16). In at least one embodiment, the LCM learning counter 1502 is implemented using a standard counter and an incrementing register (not shown) that stores the LCM count value when at each pulse of the signal NEGEDGE_ALIGNED_PULSE.

Figure 11:
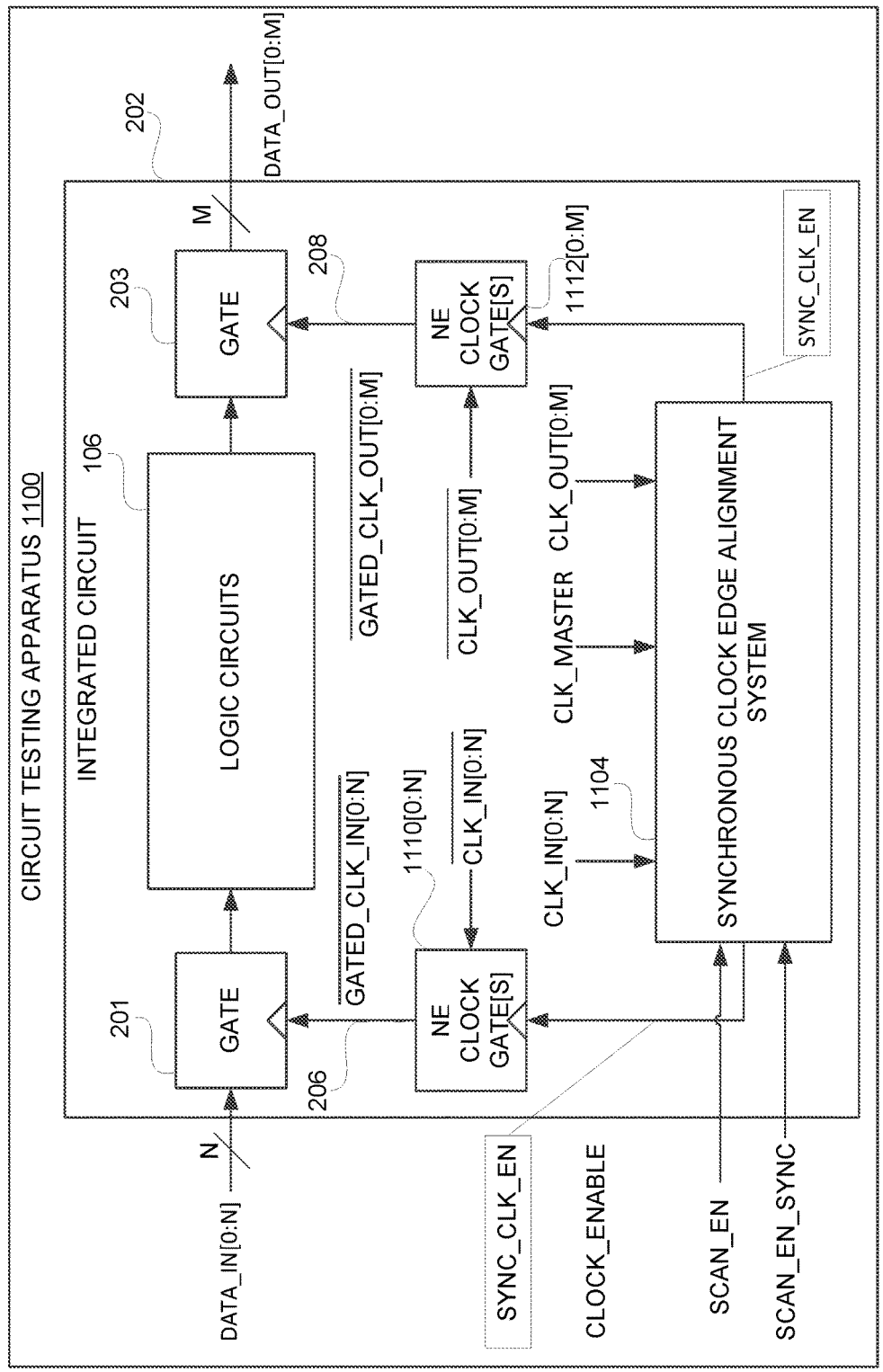
FIG. 11 depicts an embodiment of the circuit testing apparatus of FIG. 2 with negative edge triggered, synchronous, clock edge alignment.

Referring to FIGS. 3, 11, and 16, clock enable signal generation logic 1602 controls the generation of the SYNC_CLK_EN signal that releases the clock signals CLK_IN [0:N] from respective negative edge triggered (NE) clock gates 1110[0:N] and CLK_OUT[0:M] from respective NE clock gates 1112[0:M] so that the negative edges of the clock signals GATED_CLK_IN[0:N] and GATED_CLK_OUT[0: M] are aligned. In operation 310, a high LCM_ACQUIRED signal activates the clock enable signal generation logic 1602 to generate a SYNC_CLK_EN PULSE signal at time $T_4$ when the received value of the COUNT_LCM signal equals the received LCM value minus 1.

The SYNC_CLK_EN PULSE signal causes the clock enable signal generation logic 1602 to generate the SYNC_CLK_EN signal pulse at LCM minus 1 so that the SYNC_CLK_EN will release the clock signals CLK_IN[0: N] and CLK_OUT[0:M] as soon as the clock signals CLK_IN[0:N] and CLK_OUT[0:M] negative edges are aligned. In operation 312, at time $T_5$ the pulse of the SYNC_CLK_EN signal is asserted at the NE clock gates 1110[0:N] and 1112[0:M] to release the clock signals CLK_IN[0:N] and CLK_OUT[0:M] as gated clock signals GATED_CLK_IN[0:N] and GATED_CLK_OUT[0:M] while the LCM value is acquired as indicated by the duration of the high LCM_ACQUIRED signal.

Referring to FIG. 11, the gated clock signals GATED_CLK_IN[0:N] release the DATA_IN[0:N] from data gate 201 and into logic circuits 106. The gated clock signals GATED_CLK_OUT[0:M] cause the data gate 203 in operation 314 to release and, thus, provide the DATA_OUT [0:M] from logic circuits 106 to the circuit testing apparatus 1100. The synchronous clock edge alignment process 300 then repeats. In at least one embodiment, the clock enable signal generation logic 1602 is implemented using logic gates that are activated when the signal LCM_ACQUIRED indicates acquisition of the LCM value, and a comparator to compare the LCM value minus one with the number of master clock signal CLK_MASTER pulses indicated by the signal COUNT_LCM. The synchronous clock edge alignment circuit 1400 utilizes SCAN_EN_SYNC OUT signal to trigger individual on chip clock controllers (not shown) for each internal clock) simultaneously.

Thus, in at least one embodiment, a synchronous clock edge alignment system and method increases detection coverage of transition delay faults that occur in logic circuits that have data released by a clock at an input of logic circuits internal to an integrated circuit and/or released at the output of the logic circuits when testing an integrated circuit. To increase detection coverage of inter-clock transition delay faults, in at least one embodiment, the synchronous clock edge alignment system and method align same transition type edges, either positive or negative, of internal data releasing clock signals, and at least two of the clock signals have different frequencies. In at least one embodiment, aligning the edges of the clock signals increases detection of inter-clock transition delay faults.

Although embodiments have been described in detail, it should be understood that various changes, substitutions, and alterations can be made hereto without departing from the spirit and scope of the invention as defined by the appended claims.

What is claimed is:

1. An apparatus comprising:
   an integrated circuit, the integrated circuit comprising:
      logic circuits;
      data gates, coupled to an input and an output of each of the logic circuits, to receive and store data to be released to and from the logic circuits; and
      a synchronous clock edge alignment system coupled to the data gates, wherein the synchronous clock edge alignment system is configured to:
         determine when synchronous clock signal edges of a same transition type are aligned, wherein at least two of the clock signals have different frequencies and the clock signals are internal to the integrated circuit;
         provide gated clock signals to the data gates to release the stored data to and from the logic circuits when the edges of the clock signals are aligned; and
         release the data into and out of the logic circuits to increase detection of transition delay faults in the logic circuits relative to detection of transition delay faults in the logic circuits that occur when the data is released and the edges of the clock signals are not aligned.

2. The apparatus of claim 1 further comprises:
   T-flip flops having data input terminals to receive data and a set of the clock signals to clock input terminals of the T-flip flops;
   wherein to determine when synchronous clock signal edges of a same transition type are aligned, the synchronous clock edge alignment system is configured to:
      determine when next states of the data at output terminals of the T-flip flops are equivalent to a negation of current states of the data; and
      identify an alignment of the clock signal edges when the next states of the data are equivalent to a negation of the current states of the data.

3. The apparatus of claim 1 further comprises:
   T-flip flops having data input terminals to receive data and a set of the clock signals to clock input terminals of the T-flip flops;
   wherein to determine when synchronous clock signal edges of a same transition type are aligned, the synchronous clock edge alignment system is configured to:
      determine when next states of the data at output terminals of the T-flip flops are equivalent to current states of the data; and
      identify an alignment of the clock signal edges when the next states of the data are equivalent to the current states of the data.

4. The apparatus of claim 2 wherein the clock signals include a master clock signal that determines a transition from the next states to the current states of the data, wherein the synchronous clock edge alignment system is further configured to determine a least common multiple value of a number of pulses of the master clock signal between instances of when the edges of the clock signals are aligned; and
provide the gated signals to the logic circuits in the integrated circuit when a current number of pulses of the master clock since an immediately preceding occurrence of an alignment of the clock signals is equal to the least common multiple value.

5. The apparatus of claim 2 wherein the data received at respective terminals of the T-flip flops further comprises test pattern data to test functionality of the logic circuits of the integrated circuit.

6. The apparatus of claim 1 wherein the synchronous clock edge alignment system is further configured to:
   detect entry into an upcoming data capture mode; and
   initialize the synchronous clock edge alignment system to begin determination of when synchronous clock signal edges of the same transition type are aligned.

7. The apparatus of claim 1 wherein to enable the clock signals to be provided to the logic circuits in the integrated circuit, the synchronous clock edge alignment system is configured to:
   generate a signal to control release of the clock signals to one or more inputs and one or more outputs of clock gates in the integrated circuit to synchronize insertion of data to logic that promulgate test data logic circuits of the integrated circuit.

8. The apparatus of claim 1 wherein the transition type is a member of a group consisting of (1) a positive edge transition and (2) a negative edge transition.

9. A method of increasing detection coverage of inter-clock transition delay faults comprising:
   determining when synchronous clock signal edges of a same transition type are aligned, wherein at least two of clock signals of an integrated circuit have different frequencies and the clock signals are internal to an integrated circuit;
   providing gated clock signals to logic circuits in the integrated circuit to release data into and out of the logic circuits when the edges of the clock signals are aligned; and
   releasing the data into and out of the logic circuits to increase detection of transition delay faults in the logic circuits relative to detection of transition delay faults in the logic circuits that occur when the data is released and the edges of the clock signals are not aligned.

10. The method of claim 9 further comprises:
    receiving data at respective terminals of a set of T-flip flops; and
    applying a set of the clock signals to clock input terminals of the T-flip flops;
    wherein determining when synchronous clock signal edges of a same transition type are aligned comprises:
       determining when next states of the data at output terminals of the T-flip flops are equivalent to a negation of current states of the data; and
       identifying an alignment of the clock signal edges when the next states of the data are equivalent to a negation of the current states of the data.

11. The method of claim 9 further comprises:
    receiving data at respective terminals of a set of T-flip flops; and
    applying a set of the clock signals to clock input terminals of the T-flip flops;
    wherein determining when synchronous clock signal edges of a same transition type are aligned comprises:

determining when next states of the data at output terminals of the T-flip flops are equivalent to current states of the data; and identifying an alignment of the clock signal edges when the next states of the data are equivalent to the current states of the data.

12. The method of claim 10 wherein the clock signals include a master clock signal that determines a transition from the next states to the current states of the data, the method further comprising:

determining a least common multiple value of a number of pulses of the master clock signal between instances of when the edges of the clock signals are aligned; and enabling the clock signals to be provided to the circuits in the integrated circuit when a current number of pulses of the master clock since an immediately preceding occurrence of an alignment of the clock signals is equal to the least common multiple value.

13. The method of claim 10 wherein the data received at respective terminals of a set of T-flip flops further comprises test pattern data to test functionality of logic circuits of the integrated circuit.

14. The method of claim 9 further comprising:

detecting entry into an upcoming data capture mode; and initializing determination of when synchronous clock signal edges of the same transition type are aligned.

15. The method of claim 9 wherein enabling the clock signals to be provided to the logic circuits in the integrated circuit comprises:

releasing the clock signals to one or more inputs and one or more outputs of clock gates in the integrated circuit to synchronize insertion of data to logic that promulgate test data logic circuits of the integrated circuit.

16. The method of claim 9 wherein the transition type is a member of a group consisting of (1) a positive edge transition and (2) a negative edge transition.

17. An apparatus comprising:

an integrated circuit, the integrated circuit comprising:

logic circuits;

data gates, coupled to an input and an output of each of the logic circuits, to receive and store data to be released to and from the logic circuits; and a synchronous clock edge alignment system coupled to the data gates, wherein the synchronous clock edge alignment system is configured to:

receive clock signals to control release of the data to and from the logic circuits, wherein the clock signals are synchronous and have at least two frequencies;

determine when edges of the clock signals are aligned;

determine a least common multiple (LCM) value of a number of pulses of the clock signals that occur between a previous alignment of the pulses of the clock signals and a next alignment of the edges of the pulses of the clock signals;

save the LCM value;

determine when the LCM value minus one equals a number of pulses of a master clock signal, wherein the master clock signal controls overall timing of the synchronous clock edge alignment system; and release input gated clock signals from the data gates coupled to the input of the logic circuits to input data into the logic circuits and concurrently release output gated clock signals from the data gates coupled to the output of the logic circuits to output data from the logic circuits.

18. The apparatus of claim 17 wherein the clock signals to control release of the data to and from the logic circuits have a transition type that is a member of a group consisting of (1) a positive edge transition and (2) a negative edge transition.

19. A method comprising:

receiving clock signals to control release of data to and from the logic circuits of an integrated circuit, wherein the clock signals are synchronous and have at least two frequencies, wherein data gates, coupled to an input and an output of each of the logic circuits, to receive and store data to be released to and from the logic circuits;

determining when edges of the clock signals are aligned;

determining a least common multiple (LCM) value of a number of pulses of the clock signals that occur between a previous alignment of the pulses of the clock signals and a next alignment of the edges of the pulses of the clock signals;

saving the LCM value;

determining when the LCM value minus one equals a number of pulses of a master clock signal, wherein the master clock signal controls overall timing of a synchronous clock edge alignment system; and releasing input gated clock signals from the data gates coupled to the input of the logic circuits to input data into the logic circuits and concurrently release output gated clock signals from the data gates coupled to the output of the logic circuits to output data from the logic circuits.

20. The method of claim 19 wherein the clock signals to control release of the data to and from the logic circuits have a transition type that is a member of a group consisting of (1) a positive edge transition and (2) a negative edge transition.

* * * * *